United States Patent [19]
Fujimoto et al.

[11] Patent Number: 5,498,881
[45] Date of Patent: Mar. 12, 1996

[54] SUPERCONDUCTING DEVICE HAVING A SINGLE JUNCTION STRUCTURE APPROPRIATE FOR INTEGRATION

[75] Inventors: Manabu Fujimoto, Kashiwa; Keiichi Yamaguchi, Chiba; Youichi Enomoto, Tokyo; Tsutomu Mitsuzuka, Yokohama; Katsumi Suzuki, Kodaira, all of Japan

[73] Assignees: International Superconductivity Technology Ctr., Tokyo; Sharp Kabushiki Kaisha, Osaka, both of Japan

[21] Appl. No.: 309,188

[22] Filed: Sep. 20, 1994

[30] Foreign Application Priority Data

Sep. 21, 1993 [JP] Japan ................................ 5-233963

[51] Int. Cl.$^6$ ........................... H01L 29/06; H01L 39/22; H01B 12/00
[52] U.S. Cl. .................. 257/35; 257/32; 257/34; 505/190; 505/191; 505/234; 505/239; 505/329
[58] Field of Search ......................... 257/32–35; 505/190, 505/191, 234, 239, 329, 701, 702

[56] References Cited

U.S. PATENT DOCUMENTS 5,077,266 12/1991 Takagi et al. ........................... 257/34
5,382,566 1/1995 Tanaka et al. .......................... 505/329

FOREIGN PATENT DOCUMENTS 0582889 2/1994 European Pat. Off. ............... 505/234
1-241874 9/1989 Japan ..................................... 257/34
5-148095 6/1993 Japan ................................... 505/329

OTHER PUBLICATIONS

Friedl et al, "Transport Properties of Epitaxial YBaCuO Films at Step Edges," Appl. Phys. Lett., vol. 59, No. 21, 18 Nov. 1991, pp. 2751–2753.
Neumann et al. "Jpn. J. Appl. Phys." vol. 32, Part 2, No. 5B pp. L727–L729 (1993) 15 May.
Neumann et al. "Physica C" vol. 210, pp. 138–146 (1993) North–Holland.
T. Mitsuzaka et al. "Physica C" vol. 218, pp. 229–237, North–Holland.

Primary Examiner—Mahshid Saadat

[57] ABSTRACT

A superconducting device has a substrate and a superconducting film formed on the substrate. A surface of the substrate has a first surface portion of which a curvature is constant or changes continuously, a second surface portion of which a curvature is constant or changes continuously, and a third surface portion at which the first and second surface portions meet and at which the curvatures of the first and second surface portions become discontinuous. The superconducting film formed on the surface of said substrate has a grain boundary serving as a junction only in a portion corresponding to the third surface portion of the substrate.

10 Claims, 4 Drawing Sheets

SUPERCONDUCTING DEVICE HAVING A SINGLE JUNCTION STRUCTURE APPROPRIATE FOR INTEGRATION

BACKGROUND OF THE INVENTION

1. Field of the Invention

The present invention relates to a superconducting device for use in a high speed superconducting circuit such as a calculator, a high sensitivity magnetic sensor, or a passive element of an optical or ultrahigh frequency superconducting circuit, and relates to a method of producing the device.

2. Description of the Prior Art

Conventionally, in producing a flat type junction of an anisotropic superconducting thin film (e.g., an oxide high temperature superconductor), a technique of providing a stepped portion or a V-shaped groove as a discontinuous portion on a substrate on which the thin film is to be grown is used to control the crystal orientation of the thin film and to thereby achieve a grain boundary junction.

However, in order to make both sides of the junction area have an identical substrate surface height, at least three angled portions are produced, which results in growth of a plurality of grain boundaries or junctions in one junction area. Therefore, due to a variation of link or characteristics between the junctions, reproducibility of junction characteristics with regard to noise and the like is significantly degraded.

Aside from the above-mentioned method, there is a method of obtaining a junction through lithography using an electron or ion beam. By patterning a fine V-shaped groove on a substrate surface by irradiation of the substrate surface with such an electron or ion beam, a junction can be obtained while the height of the substrate surface is kept constant except for the junction area. However, in such a case, it is difficult to reduce the width (diameter) of the beam to a value smaller than the coherence length of the superconductor, which consequently causes a problem that a plurality of uncontrolled junctions are formed in the fine V-shaped groove, resulting in a non-homogeneous junction area.

There is also a technique of locally disturbing the crystallinity of a substrate by irradiating the substrate with such a weak beam that forms no grooves. This technique, however, has the same drawback as described above.

As described above, with the method utilizing the lithography technique, it is difficult to achieve a single junction in one junction area, which reduces the controllability of the junction characteristics.

As another technique which does not utilizes the lithography technique, there is a bicrystal technique by which two substrates are adhered to each other, which technique cannot integrate junctions.

Among the conventional techniques, the technique utilizing the lithography technique has an advantage in formation of plural junctions on the same substrate as well as formation of the junctions in arbitrary positions. This technique, however, has a drawback that it is impossible to make every area have only a single junction.

On the contrary, the bicrystal technique which can easily obtain a single controlled junction has a drawback that it is not appropriate for integration.

SUMMARY OF THE INVENTION

Accordingly, it is an object of the present invention to provide a superconducting device which has a structure appropriate for integration and in which only a single junction having controlled superconductor characteristics is formed in an arbitrary position.

Another object of the present invention is to provide a superconducting device having the junctions integrated.

A further object of the present invention is to provide a method of producing such superconducting devices.

In order to accomplish the above objects, the present invention provides a superconducting device, comprising:

a substrate with a surface having a first surface portion whose curvature is constant or changes continuously, a second surface portion whose curvature is constant or changes continuously, and a third surface portion at which the first and second surface portions meet and at which the curvatures of the first and second surface portions become discontinuous; and a superconducting film formed on the surface of the substrate and having a grain boundary serving as a junction only in a portion corresponding to the third surface portion of the substrate.

The present invention is based on the fact that when the surface on which a superconducting thin film grows has a radius of curvature larger than a specified value, a curved superconducting thin film including no crystal grain boundary (referred to merely as "grain boundary" hereinafter) can be obtained. According to the present invention, taking advantage of this characteristic of the superconducting thin film, only one grain boundary junction plane is formed only in the third surface portion of the substrate at which the first and second surface portions of the substrate surface having curvatures not allowing the growth of grain boundaries meet or discontinue and at which the curvatures of the first and second surface portions become discontinuous. By thus controlling the surface of the substrate, only one superconducting junction can be formed in an arbitrary fine area and production of a quantum effect device characteristic of the superconductor is facilitated.

In an embodiment, the substrate has a plurality of sets of the first, second and third surface portions.

The first and second surface portions of the substrate may have various configurations and may be symmetrical or asymmetrical with respect the third surface portion.

For example, in an embodiment, each of the first and second surface portions comprises a flat horizontal portion and a convexly curved portion smoothly continuous from the flat horizontal portion. The flat horizontal portions of the first and second surface portions are flush with each other. In this case, the third surface portion is disposed in a recessed portion between the convexly curved portions. This superconducting device can be produced by a method which has the steps of:

forming a V-shaped groove having inclined walls and a bottom on a surface of a substrate by a focused ion beam;

abrading, by an ion milling method, edges of the substrate defined between the surface of the substrate and the inclined walls of said groove such that the surface on both sides of the groove is curved toward the bottom of the groove; and forming a superconducting film on the surface of the substrate including in the groove.

In another embodiment, each of the first and second surface portions consists of a flat horizontal portion and a concavely curved portion smoothly continuous from the flat horizontal portion. The flat horizontal portions of the first and second surface portions are flush with each other. In this case, the third surface portion is disposed in a protruding portion between the concavely curved portions.

In an embodiment, the substrate has a stepped configuration, and the first surface portion consists of an upper flat horizontal portion, the second surface portion consists of a lower flat horizontal portion, a concavely curved portion smoothly continuous from the lower flat horizontal portion and a flat inclined portion smoothly continuous from the concavely curved portion. In this case, the third surface portion is disposed between the upper flat horizontal portion and the flat inclined portion.

In an embodiment, the substrate has a generally U-shaped groove. In this case, the first surface portion consists of a flat horizontal portion, and the second surface portion consists of a surface defining the generally U-shaped groove. In this case, the third surface portion is an edge disposed between the flat horizontal portion and the surface defining the generally U-shaped groove.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The basic structure of the present invention will be described with reference to the attached drawings.

FIGS. 1 through 6 are sectional views of examples of superconducting devices in accordance with the present invention.

Figure 1:
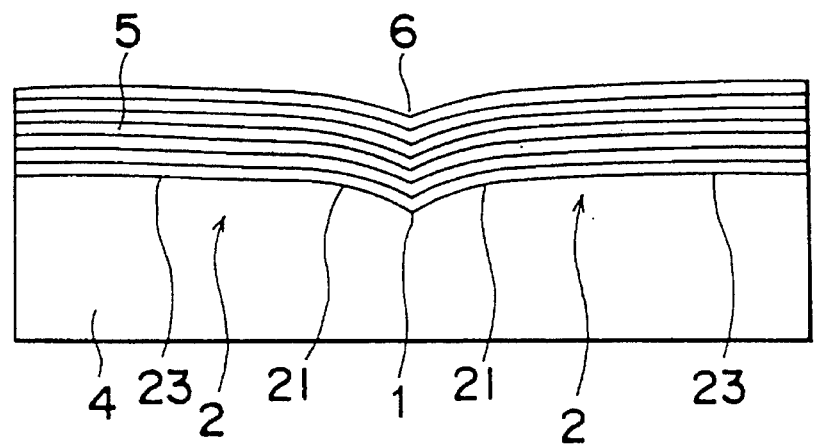
FIG. 1 is a sectional view of an example of a superconducting device having only one junction of the present invention, wherein the junction is formed between two convexly curved portions.

FIG. 1 shows a superconducting device having a single junction and is basically comprised of a substrate 4, a discontinuous portion 1 on a surface of the substrate 4, continuous portions 2 on both sides of the discontinuous curvature portion 1, a low-carrier superconducting thin film 5 grown on the substrate 4, and a junction 6 formed in the superconducting thin film 5. The continuous portion 2 of the substrate 4 is a place where its curvature is constant or changes continuously and the discontinuous portion is an angled portion at which the continuous portions 2 on both sides meet and at which the curvatures of the substrate continuous portions 2 become discontinuous. In this example, the continuous portion 2 consists of a convexly curved portion 21 and a flat portion 23 smoothly continuous from the convexly curved portion 21.

The lines shown in the superconducting thin film 5 indicates crystal faces on which supercurrent flows.

The characteristics of the superconducting thin film 5 grown on the curved portion 21 of the substrate 4 are equivalent to the characteristics of the thin film 5 on the flat horizontal portion 23 because no grain boundaries and hence no junctions are existing in those portions of the thin film. Meanwhile, a grain boundary is formed in the thin film 5 on the discontinuous portion 1 of the substrate 4 due to an abrupt change of the surface of the substrate to form only one (one plane of) superconducting junction 6 in the superconducting thin film 5.

Figure 2:
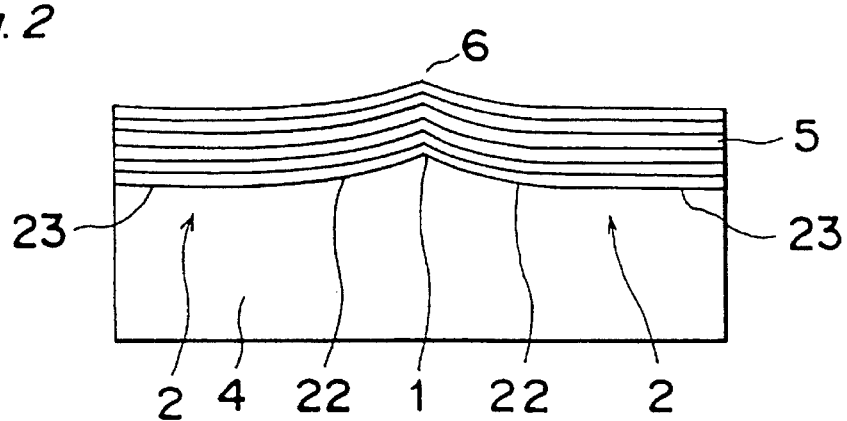
FIG. 2 is a sectional view of another example of a superconducting device having only one junction of the present invention, wherein the junction is formed between two concavely curved portions.

Although FIG. 1 shows a structure having the junction 6 at a recessed portion between the two convexly curved portions 21 of the substrate, there can be a structure having the junction 6 at a protruding portion of the substrate as shown in FIG. 2. It is to be noted that in FIG. 2, components or parts similar to those in FIG. 1 are denoted by the same reference numerals. In FIG. 2, a reference numeral 22 denotes a concavely curved portion continuous smoothly from the flat horizontal portion 23 and the junction 6 is formed at the protruding continuous portion 1 located between the concavely curved portions 22.

Although the junction structures are illustrated symmetrically in FIGS. 1 and 2, the junction structures can be asymmetrical.

Figure 3:
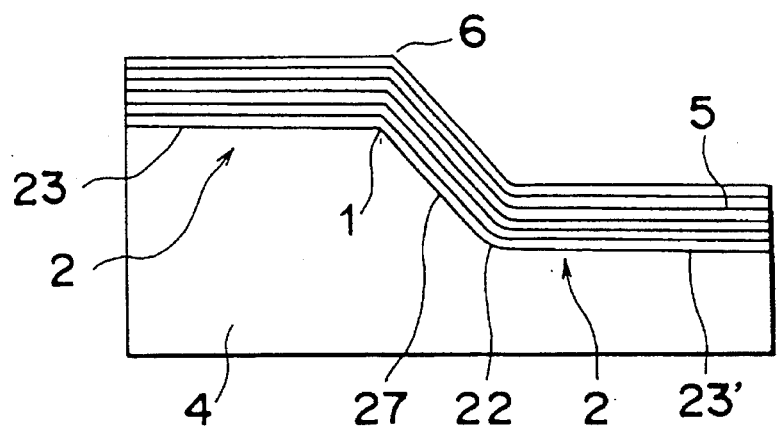
FIG. 3 is a sectional view of a stepped type example of a superconducting device having only one junction of the present invention.

The structure of the present invention can be achieved by producing a stepped structure including a curved portion as shown in FIG. 3. In FIG. 3, components or parts similar to those in FIGS. 1 and 2 are denoted by the same reference numerals. In the example of FIG. 3, a continuous portion 2 on one side of the discontinuous portion 1 consists of an upper flat horizontal portion 23, while another continuous portion 2 on the other side of the discontinuous portion 1 consists of an inclined flat portion 27, a concavely curved portion 22 and a lower flat horizontal portion 23'. The inclined flat portion 27, the concavely curved portion 22 and the lower flat horizontal portion 23' are smoothly continuous from each other. The structure is classified into the protruding type of FIG. 2.

Figure 4:
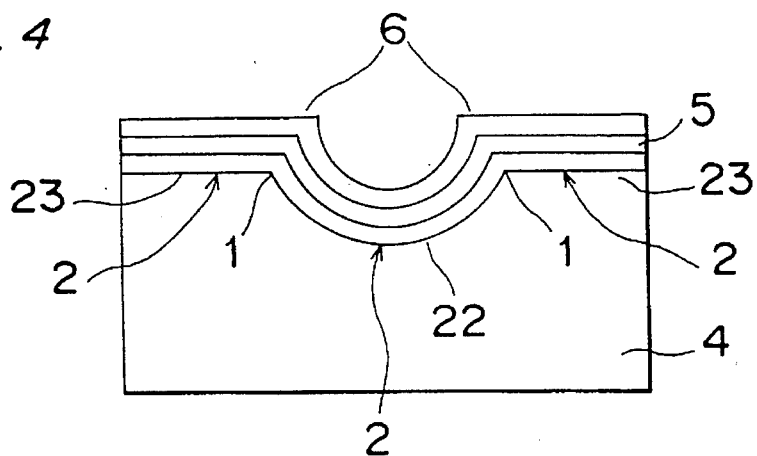
FIG. 4 is a sectional view of an example of a superconducting device having a generally U-shaped groove.

The superconducting device of the present invention can be achieved by making a groove with an U-shaped section on a surface of the substrate as shown in FIG. 4. In this case, the U-shaped groove constitutes the concavely curved portion 22 of the continuous portion 2, and each of edges defined between the generally U-shaped groove (curved portion) 22 and the flat horizontal portions 23 on both sides of the groove 22 constitutes the discontinuous portion 1. In FIG. 4, components or parts similar to those in FIGS. 1–3 are denoted by the same reference numerals. The structure of FIG. 4 is classified into the protruding type of FIG. 2.

Figure 5:
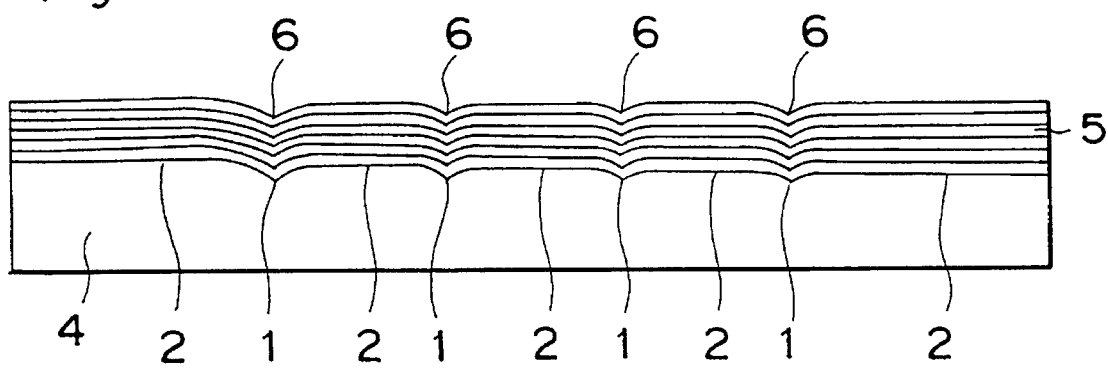
FIG. 5 is a sectional view of an example of a superconducting device having a plurality of junctions integrated.
Figure 6:
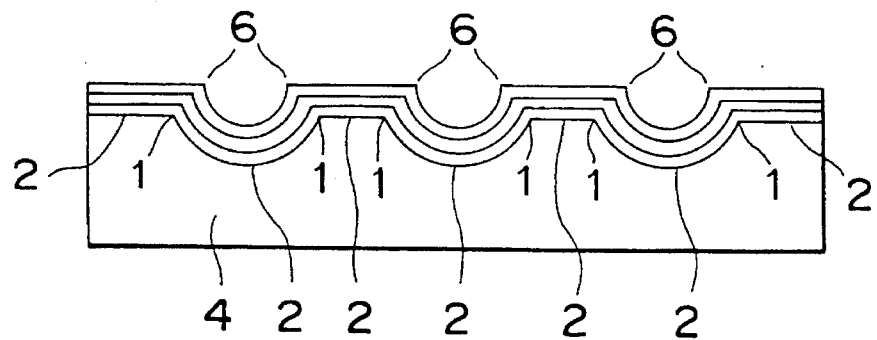
FIG. 6 is a sectional view of another example of a superconducting device having a plurality of junctions integrated.

When forming a plurality of junctions on the same substrate 4, the junctions 6 as shown in FIGS. 1, 2, 3, or 4 are used. FIG. 5 shows a case in which a plurality of structures as shown in FIG. 1 are integratedly arranged. FIG. 6 shows a case in which a plurality of generally U-shaped grooves as shown in FIG. 4 are integratedly arranged.

Furthermore, the junctions 6 shown in FIGS. 1, 2, 3, and/or 4 may be integrated in combination.

FIGS. 7A through 7D are explanatory flow diagrams of a method of producing a superconducting device as shown in FIG. 1.

Figure 7A:
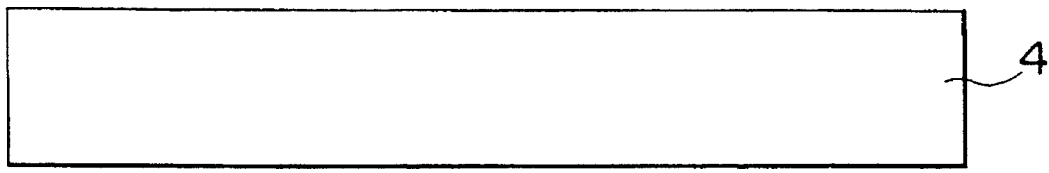
FIGS. 7A, 7B, 7C, and 7D are explanatory flow diagrams of a method of producing a superconducting device as shown in FIG. 1.
Figure 7B:
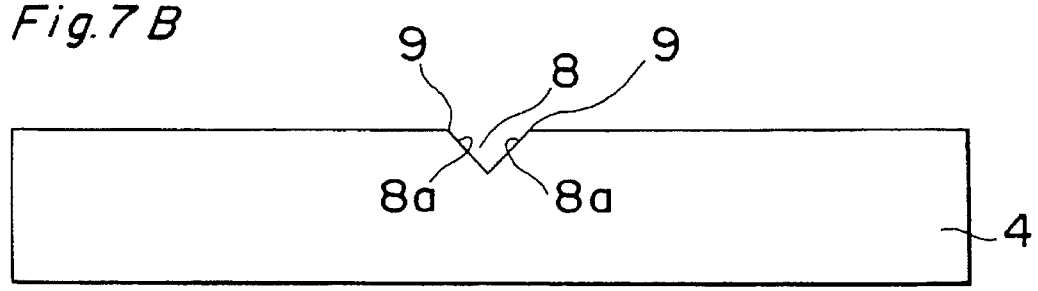

First, as shown in FIG. 7A, an MgO (100) substrate 4 is prepared. Then, the surface of the substrate 4 is irradiated with a focused ion beam (FIB) of $Ga^+$ ions, so that a fine V-shaped groove 8 having a generally V-shaped section is formed as shown in FIG. 7B. The FIB irradiation is performed under conditions of, for instance, a beam current of 5 pA, an acceleration voltage of 30 keV, and irradiation time of 60 seconds.

Figure 7C:
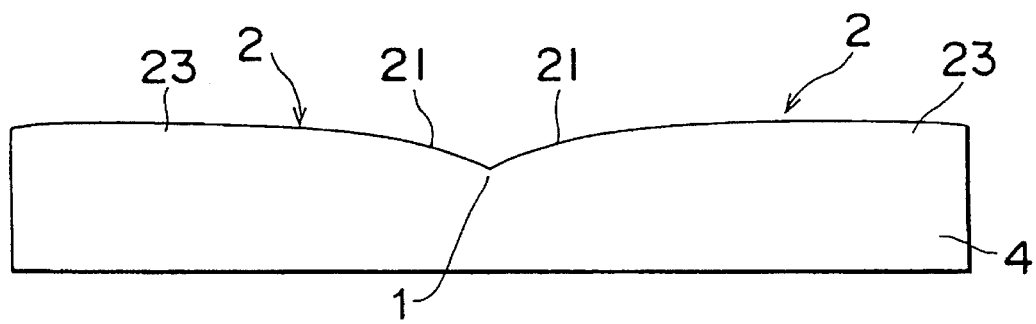

Then, two edges 9 defined between inclined walls 8a of the fine V-shaped groove 8 and the substrate surface are milled or abraded by ion beam etching using a Kaufman type $Ar^+$-ion milling apparatus to form the convexly curved portions 21 smoothly continuous from the flat horizontal portions 23, as shown in FIG. 7C. The milling process is effected under the condition that a beam is applied at a low angle of 10° with respect to a rotating sample table at an acceleration voltage of 500 eV and a current density of 5 $mA/cm^2$ for 30 minutes.

As a result, an angle ($\theta$) of 30° in the discontinuous portion 1 and a minimum radius of curvature ($\rho$) of 500 nm in the continuous portions 2 are achieved. Among the above factors, the angle $\theta$ corresponds to a critical current density Jc at the junction and is able to be controlled by changing the above conditions for the FIB irradiation. It is to be noted, however, that a detailed-condition setting must be performed for each apparatus because of an apparatus dependence. When $\rho$ is 500 nm or less, a grain boundary is grown due to a lattice distortion caused by curving when a YBCO thin film is deposited on the MgO substrate 4 at a later step.

Figure 7D:
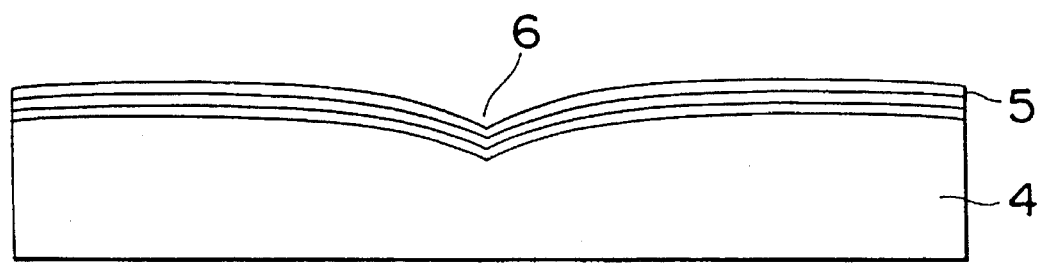

Finally, a c-axis oriented YBCO thin film 5 is formed on the substrate 4 having a curved structure by the pulse laser deposition (PLD) method, as shown in FIG. 7D. The thin-film producing conditions are as follows: a target of polycrystalline YBCO, a substrate temperature of 770° C., an oxygen partial pressure of 100 mTorr, a film growth time of 27 minutes, and a film thickness of 300 nm. A KrF excimer laser having a wavelength of 248 nm and an energy density of 5 $J/cm^2$ is used.

As a result, a superconducting junction 6 is formed in the groove portion interposed between the two convexly curved portions 21.

The critical current density and the tunnel resistance at the junction can be controlled by processing the YBCO thin film 5 in a fine line pattern having an appropriate pattern width so that the fine line traverses the junction portion.

The superconducting device produced by the above method obtained a critical current (Ic) of 0.2 mA and a normal conducting resistance (Rn) of 0.8 $\Omega$ at the junction when the superconducting thin film had a width of 5 $\mu$m.

Figure 8:
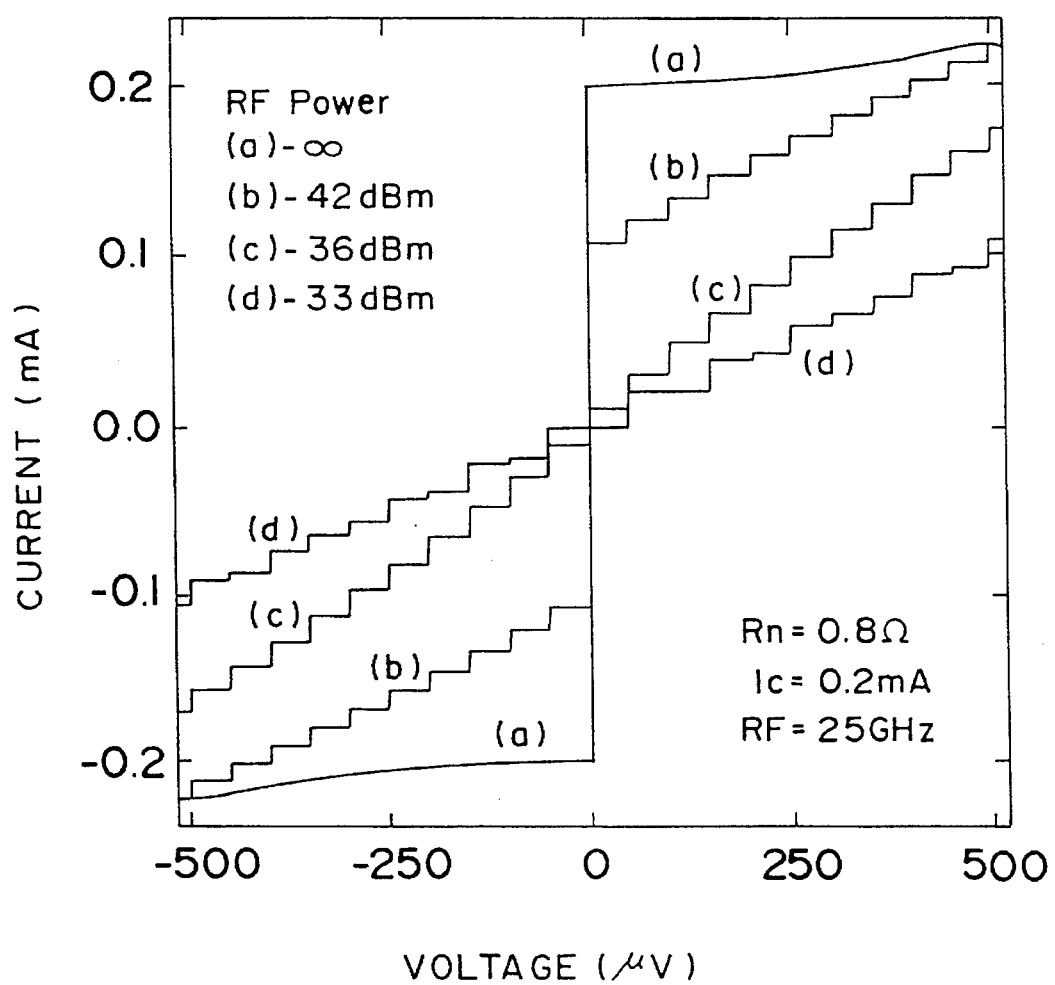
FIG. 8 is a graph showing current-voltage characteristics (microwave power dependence) of a junction under irradiation of a microwave at a frequency of 25 GHz.

FIG. 8 shows the microwave power (i.e., RF power) dependence of the current-voltage (I-V) characteristics of the superconducting junction under microwave irradiation at a frequency of 25 GHz. In FIG. 8, (a), (b), (c), and (d) show I-V characteristics corresponding to different microwave powers. More specifically, (a) is for the microwave being off, (b) is for −42 dBm, (c) is for −36 dBm, and (d) is for −33 dBm. The indications in this figure are relative values of the indications of outputs of a microwave signal source.

Clear Shapiro-steps are observed at voltage intervals corresponding to the frequencies of the microwave irradiated. With the microwave at a power of 25 GHz, the Shapiro-steps appear at voltage intervals of approx. 50 $\mu$V according to Josephson's relational expressions. FIG. 8 also indicates that the I-V characteristics are stepped at intervals of approx. 50 $\mu$V. According as the microwave power is increased (cases (b), (c), and (d)), the critical current Ic of the junction reduces, and the critical current becomes completely zero in the case of (d). The above fact implies that a quality Josephson-junction was formed. As the result of analyzing the I-V characteristics using the resistive shunted junction model, the I-V characteristics of the embodiments coincided with a model characteristic for the case where a single Josephson-junction operates. This fact proves that a single, homogeneous junction can be produced with high reproducibility according to the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A superconducting device, comprising:

a substrate with a surface having a first surface portion with a non-zero curvature, a second surface portion with a curvature, said first and second surface portions meeting at a junction portion, where the curvatures of said first and second surface portions become discontinuous; and a superconducting film formed on said surface of the substrate and having a grain boundary serving as a junction only at said junction portion.

2. The superconducting device according to claim 1, wherein said substrate has a plurality of sets of said first, second and junction portions.

3. A superconducting device, comprising:

a substrate with a surface having a first surface portion with a curvature, a second surface portion with a curvature, and a junction portion at which said first and second surface portions meet and at which the curvatures of said first and second surface portions become discontinuous;

a superconducting film formed on said surface of the substrate and having a grain boundary serving as a junction only at said junction portion, wherein each of said first and second surface portions further comprises a flat horizontal portion and said curvature of each comprises a convexly curved portion extending smoothly and continuously from the flat horizontal portion to a terminus where said first and second portions meet, said flat horizontal portions of the first and second surface portions being coplanar with each other, and said junction portion being located at said terminus.

4. The superconducting device according to claim 3, wherein said substrate has a plurality of sets of said first, second and junction portions.

5. A superconducting device, comprising:

a substrate with a surface having a first surface portion with a curvature, a second surface portion with a curvature, and a junction portion at which said first and second surface portions meet and at which the curvatures of said first and second surface portions become discontinuous;

a superconducting film formed on said surface of the substrate and having a grain boundary serving as a junction only at said junction portion, wherein each of said first and second surface portions further comprises a flat horizontal portion and said curvature of each comprises a concavely curved portion extending smoothly and continuously from the flat horizontal portion to a terminus where said first and second portions meet, said flat horizontal portions of the first and second surface portions being coplanar with each other, and said junction portion being located at said terminus.

6. The superconducting device according to claim 5, wherein said substrate has a plurality of sets of said first, second and junction portions.

7. A superconducting device, comprising:

a substrate with a surface having a first surface portion, a second surface portion with a curvature, and a junction portion at which said first and second surface portions meet and at which the curvatures of said first;

a superconducting film formed on said surface of the substrate and having a grain boundary serving as a junction only at said junction portion, wherein said substrate has a stepped configuration, said first surface portion consists of an upper flat horizontal portion, said second surface portion consists of a lower flat horizontal portion, a flat inclined portion extending from a terminus with said upper flat horizontal portion and extending smoothly and continuously toward said lower flat horizontal portion and a concavely curved portion extending smoothly and continuously between said flat inclined portion and said lower flat horizontal portion, and said junction portion is located at said terminus.

8. The superconducting device according to claim 7, wherein said substrate has a plurality of sets of said first, second and junction portions.

9. A superconducting device, comprising:

a substrate with a surface having a first surface portion, a second surface portion with a curvature, and junction portions at which said first and second surface portions meet and at which the curvature of said second surface portion becomes discontinuous;

a superconducting film formed on said surface of the substrate and having a grain boundary serving as a junction only at said junction portions, wherein:

said first surface portion consists of flat horizontal portions, said second surface portion consists of a surface defining a generally U-shaped groove having a terminus with each of said flat horizontal portions and said each of said junction portions is located at a respective said terminus.

10. The superconducting device according to claim 9, wherein said substrate has a plurality of sets of said first, second and junction portions.

* * * * *